(12) United States Patent
Chang (10) Patent No.: US 8,305,537 B2
(45) Date of Patent: Nov. 6, 2012

(54) PIXEL ARRAY

(75) Inventor: Hsi-Ming Chang, Taoyuan County (TW)

(73) Assignee: Chunghwa Pictue Tubes, Ltd., Taoyuan (TW)

( * ) Notice: Subject to any disclaimer, the term of this patent is extended or adjusted under 35 U.S.C. 154(b) by 391 days.

(21) Appl. No.: 12/689,241

(22) Filed: Jan. 19, 2010

(65) Prior Publication Data

US 2011/0061899 A1 Mar. 17, 2011

(30) Foreign Application Priority Data

Sep. 17, 2009 (TW) ................................ 98131391 A (51) Int. Cl.
*G02F 1/1343* (2006.01)
(52) U.S. Cl. ............ 349/139; 349/56; 349/84; 349/143; 349/144
(58) Field of Classification Search ............... 349/56, 349/84, 139, 143, 144
See application file for complete search history.

(56) References Cited

U.S. PATENT DOCUMENTS

| 6,738,106 B1 | 5/2004 | Tanahara et al. |
| 6,839,115 B2 | 1/2005 | Hong et al. |
| 2009/0009674 A1* | 1/2009 | Chung et al. ............ 349/39 |
| 2010/0295830 A1* | 11/2010 | Chen ....................... 345/206 |

FOREIGN PATENT DOCUMENTS

| JP | 2000196104 | 7/2000 |
| TW | 200824128 | 6/2008 |

OTHER PUBLICATIONS

"First Office Action of China Counterpart Application", issued on May 18, 2011, p. 1-p. 4, in which the listed reference was cited.

* cited by examiner

*Primary Examiner* — Jennifer Doan
(74) *Attorney, Agent, or Firm* — Jianq Chyun IP Office (57) ABSTRACT

A pixel array including first signal lines, second signal lines, switch devices, and pixel units coupling to the first signal lines and the second signal lines through the switch devices is provided. The first signal lines and the second signal lines are formed on different films. Each of the pixel units includes a common electrode line. In each of the pixel units of an $i^{th}$ row, the common electrode line has at least one first line segment and at least one second segment coupled to each other and formed on different films, and a distance between an $(i-1)^{th}$ first signal line and the first line segment is not equal to that between the $(i-1)^{th}$ first signal line and the second line segment. The first signal lines are either scan lines or data lines of the pixel array, and the second signal lines are the other kind.

21 Claims, 6 Drawing Sheets

PIXEL ARRAY

CROSS-REFERENCE TO RELATED APPLICATION

This application claims the priority benefit of Taiwan application serial no. 98131391, filed on Sep. 17, 2009. The entirety of the above-mentioned patent application is hereby incorporated by reference herein and made a part of specification.

BACKGROUND OF THE INVENTION

1. Field of the Invention

The invention is generally related to a pixel array, and more particularly, to a pixel array having a high aperture ratio.

2. Description of Related Art

Figure 1A:
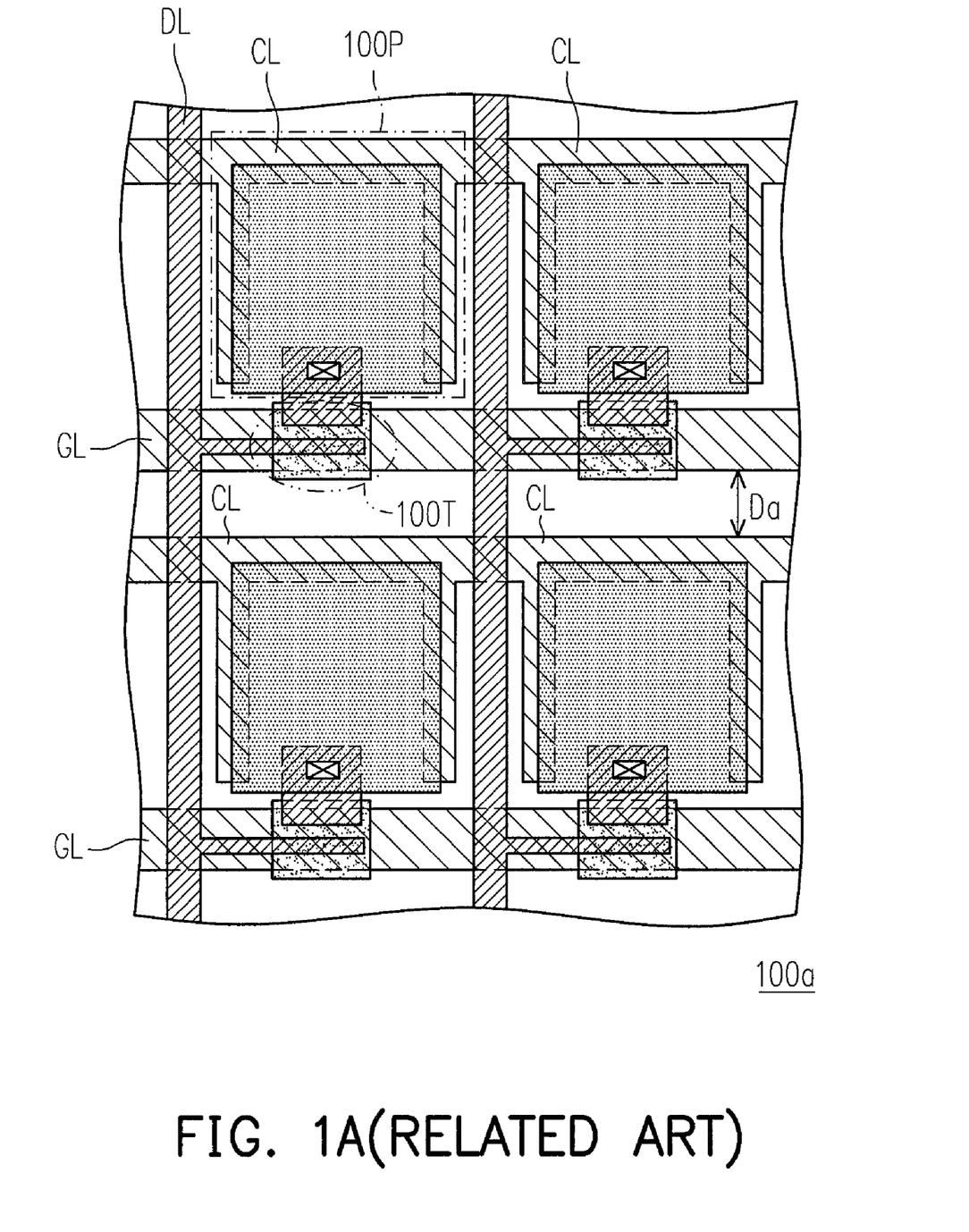
FIG. 1A and FIG. 1B are schematic top views illustrating a conventional pixel array.

FIG. 1A is a schematic top view illustrating a conventional pixel array. Referring to FIG. 1A, a pixel array 100a includes a plurality of scan lines GL, a plurality of data lines DL, a plurality of thin film transistors (TFTs) 100T, and a plurality of pixel units 100P. The pixel units 100P are coupled to the scan lines GL and the data lines DL through the TFTs 100T. Moreover, each of the pixel units 100P includes a common electrode line CL arranged parallel to the scan lines GL.

Accordingly, the scan lines GL and the common electrode line CL are formed by a first conductive layer (not drawn), whereas the data lines DL are formed by a second conductive layer (not drawn) disposed above the first conductive layer. Moreover, in order to prevent conductivity or electrical interference between the scan lines GL and the common electrode line CL formed on the same film, the scan lines GL and the common electrode line CL are spaced by a distance Da. As shown in FIG. 1A, image display is not possible in the layout space within the distance Da.

Figure 1B:
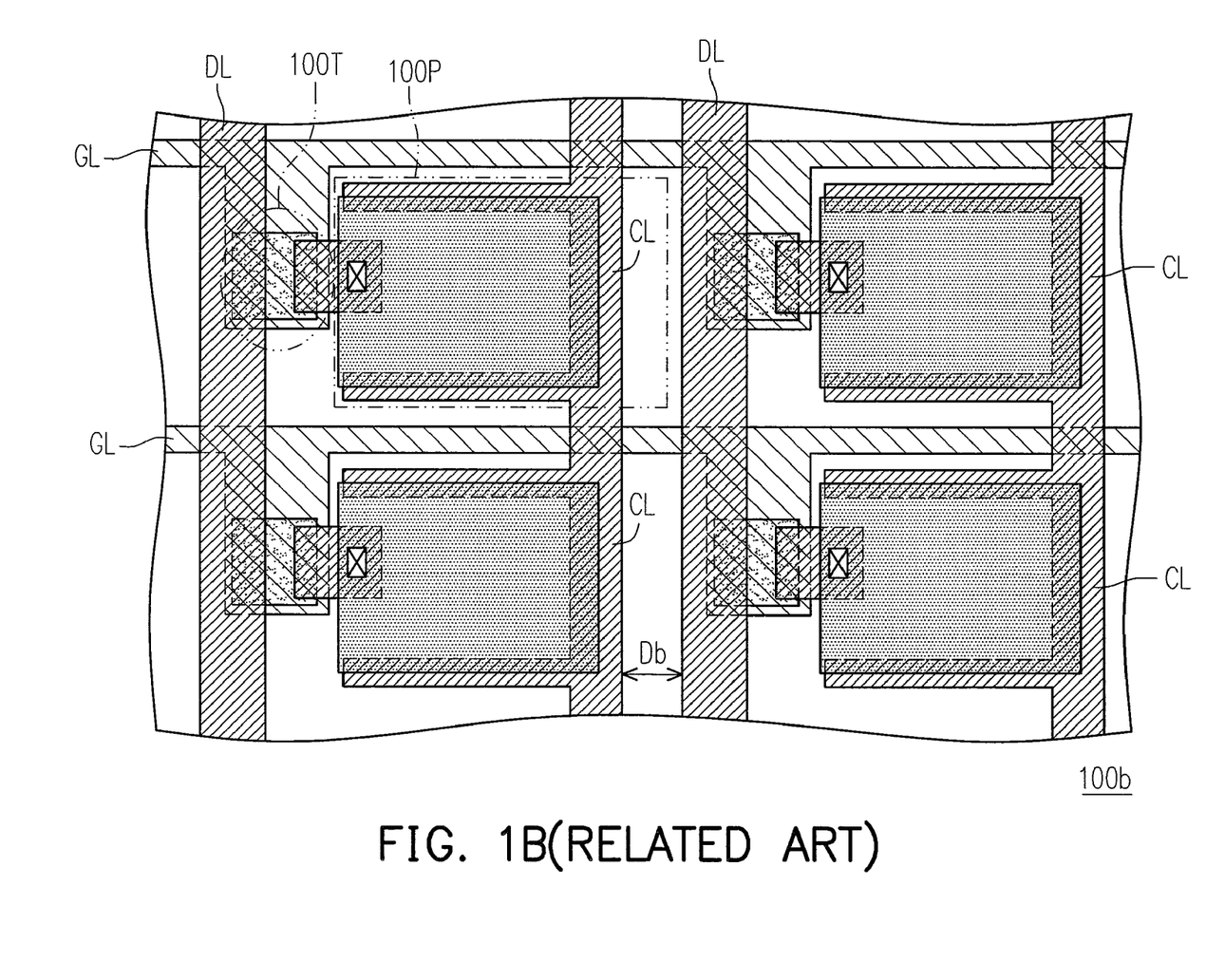

FIG. 1B illustrates another conventional pixel array. The scan lines GL are formed by the first conductive layer (not drawn), whereas the data lines DL and the common electrode line CL are formed by the second conductive layer (not drawn) disposed above the first conductive layer. To prevent conductivity or electrical interference between the data lines DL and the common electrode line CL formed on the same film, the data lines DL and the common electrode line CL are also spaced by a distance Db. Similarly, as shown in FIG. 1B, image display is not possible in the layout space within the distance Db.

SUMMARY OF THE INVENTION

Aspects of the invention provide a pixel array having a high aperture ratio.

Moreover, aspects of the invention provide a pixel array including a plurality of first signal lines, a plurality of second signal lines, a plurality of switch devices, and a plurality of pixel units. The first signal lines and the second signal lines are formed on different films, and the pixel units are coupled to the first signal lines and the second signal lines through the switch devices. Each of the pixel units includes a common electrode line. In each of the pixel units of an ith row, the common electrode line has at least a first line segment and at least a second line segment, in which the first line segment and the second line segment are formed on different films and coupled to each other. Moreover, a distance between an (i-1)th first signal line and the first line segment is not equal to a distance between the (i-1)th first signal line and the second line segment. The first signal lines are either the scan lines or the data lines of the pixel array, and the second signal lines are the other kind.

In one embodiment of the invention, when the first signal lines are the scan lines and the second signal lines are the data lines, in each of the pixel units of the ith row, a distance between an (i-1)th scan line and the second line segment is smaller than a distance between the (i-1)th scan line and the first line segment. In one embodiment of the invention, each of the scan lines and a neighboring second line segment are formed on different films. In another embodiment of the invention, each of the scan lines and a neighboring first line segment are formed on a same film. In yet another embodiment of the invention, the scan lines are arranged substantially parallel to the common electrode lines. In yet another embodiment of the invention, the data lines intersect the common electrode lines.

In one embodiment of the invention, each of the common electrode lines further includes at least a third line segment coupled to the second line segment. In one embodiment of the invention, in each of the pixel units of the ith row, the third line segment overlaps the (i-1)th scan line. In another embodiment of the invention, in each of the pixel units of the ith row, the (i-1)th scan line overlaps the third line segment. In yet another embodiment of the invention, the third line segment and second line segment are formed on the same film, and each of the scan lines and a neighboring third line segment are formed on different films.

In one embodiment of the invention, when the first signal lines are the data lines and the second signal lines are the scan lines, in each of the pixel units of the ith row, a distance between an (i-1)th data line and the second line segment is smaller than a distance between the (i-1)th data line and the first line segment. In one embodiment of the invention, each of the data lines and a neighboring second line segment are formed on different films. In another embodiment of the invention, each of the data lines and a neighboring first line segment are formed on the same film. In yet another embodiment of the invention, the data lines are arranged substantially parallel to the common electrode lines. In yet another embodiment of the invention, the scan lines intersect the common electrode lines.

In one embodiment of the invention, each of the common electrode lines further includes at least a third line segment coupled to the second line segment. In one embodiment of the invention, in each of the pixel units of the ith row, the third line segment overlaps the (i-1)th data line. In another embodiment of the invention, in each of the pixel units of the ith row, the (i-1)th data line overlaps the third line segment. In yet another embodiment of the invention, the third line segment and second line segment are formed on the same film, and each of the data lines and a neighboring third line segment are formed on different films.

In summary, by configuring the common electrode lines and the scan lines or the data lines to design the layout of the common electrode lines, the aperture ratio of the pixel arrays embodied herein have an enhanced aperture ratio.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Examples illustrating the pixel array according to the present embodiment are provided hereafter, although the invention is not limited to only the following implementations.

First Embodiment

Figure 2A:
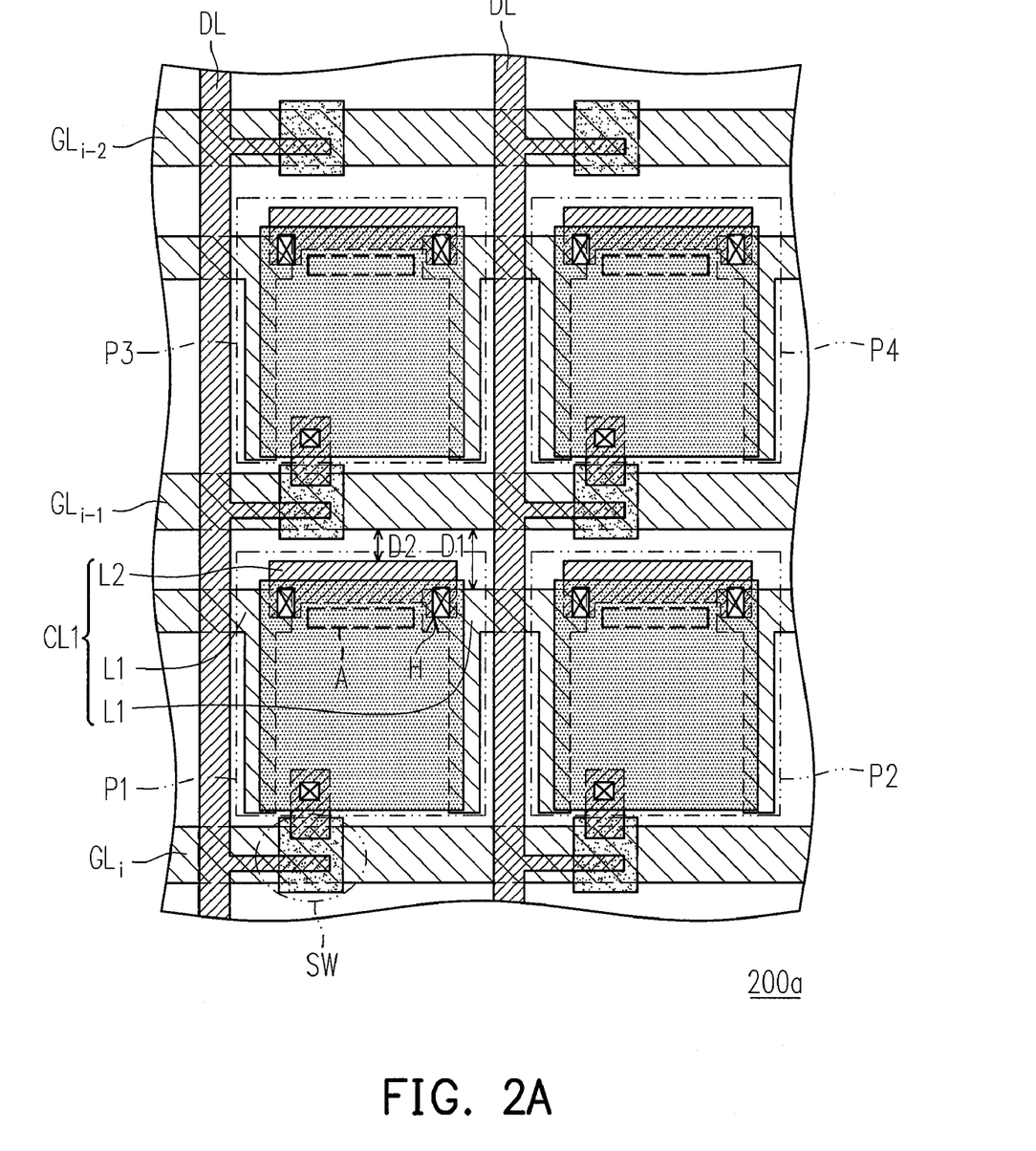
FIG. 2A and FIG. 2B are schematic top views illustrating two pixel arrays in accordance with a first embodiment of the invention.

FIG. 2A is a schematic top view illustrating a pixel array in accordance with a first embodiment of the invention. Referring to FIG. 2A, a pixel array 200a of the present embodiment includes a plurality of first signal lines, a plurality of second signal lines, a plurality of switch devices SW, and a plurality of pixel units P1, P2, P3, P4 . . . . The switch devices SW are thin film transistors (TFTs), for example. In the present embodiment, the first signal lines are scan lines GLi-2, GLi-1, GLi . . . for example, and the second signal lines are data lines DL, for instance. Moreover, the pixel units P1, P2, P3, P4 . . . can couple to the scan lines GLi,GLi-1 . . . and the data lines DL through the switch devices SW.

It should be noted that the invention do not restrict the first signal lines and the second signal lines as the scan lines GLi-2, GLi-1, GLi . . . and the data lines DL, respectively. However, in the present embodiment, description is mainly provided for the pixel array 200a formed by the first signal lines designated as the scan lines GLi-2, GLi-1, GLi . . . and the second data lines designated as the data lines DL.

Clearly, other components, such as pixel electrodes, can be included in the pixel array 200a and the pixel units P1, P2, P3, P4 . . . therein. However, for clarity of description, the coupling methods and functionalities of these components are not included in the description. The present embodiment illustrates only the essential related designs for description.

In the present embodiment, the scan lines GLi-2, GLi-1, GLi . . . and the data lines are respectively formed on different films. An insulating material is typically disposed therebetween to lower the electrical interference between these two kinds of signal lines. For example, the scan lines GLi-2, GLi-1, GLi . . . are formed by a first conductive layer, whereas the data lines DL are formed by a second conductive layer disposed above the first conductive layer. An insulating layer (not drawn) is disposed between the first conductive layer and the second conductive layer. Of course, since the actual layout of the films is performed according to product needs, the invention is not limited by the aforementioned layout scheme.

In the present embodiment, each of the pixel units P1, P2, P3, P4 . . . respectively includes a common electrode line CL1. The common electrode lines CL1 are arranged substantially parallel to the scan lines GLi-2, GLi-1, GLi . . . and intersecting the data lines DL. Moreover, as shown in FIG. 2A, each of the common electrode lines CL1 has at least a first line segment L1 and at least a second line segment L2 coupled to each other. The first line segment L1 is arranged substantially parallel to the scan lines GLi-2, GLi-1, GLi . . . and intersecting the data lines DL.

In the present embodiment, the first line segment L1 and the second line segment L2 are formed on different films. More specifically, the present embodiment assumes the first line segment L1 is formed by the first conductive layer, and assumes the second line segment L2 coupled to the first line segment L1 is formed instead by the second conductive layer, although the invention is not limited thereto. In practice, the first line segment L1 and the second line segment L2 can be electrically coupled through at least a contact window H.

Typically speaking, according to different manufacturing conditions, in order to prevent conductivity or electrical interference between different components on the same film, a predetermined distance is kept between such components. In the present embodiment, although the first line segment L1 and the scan lines GLi-2, GLi-1, GLi . . . are formed on the same film, because the second line segment L2 and the scan lines GLi-2, GLi-1, GLi . . . are formed on different films, a distance D2 between the second line segment L2 and the scan lines GLi-2, GLi-1, GLi . . . can be less than a distance D1 between the first line segment L1 and the scan lines GLi-2, GLi-1, GLi . . . .

Compared with the pixel units 100P depicted in FIG. 1A, since the common electrode lines CL1 are not disposed at a location A in the pixel units P1, P2, P3, P4 . . . of the present embodiment, an enhanced aperture ratio is obtained for the pixel units P1, P2, P3, P4 . . . .

Figure 2B:
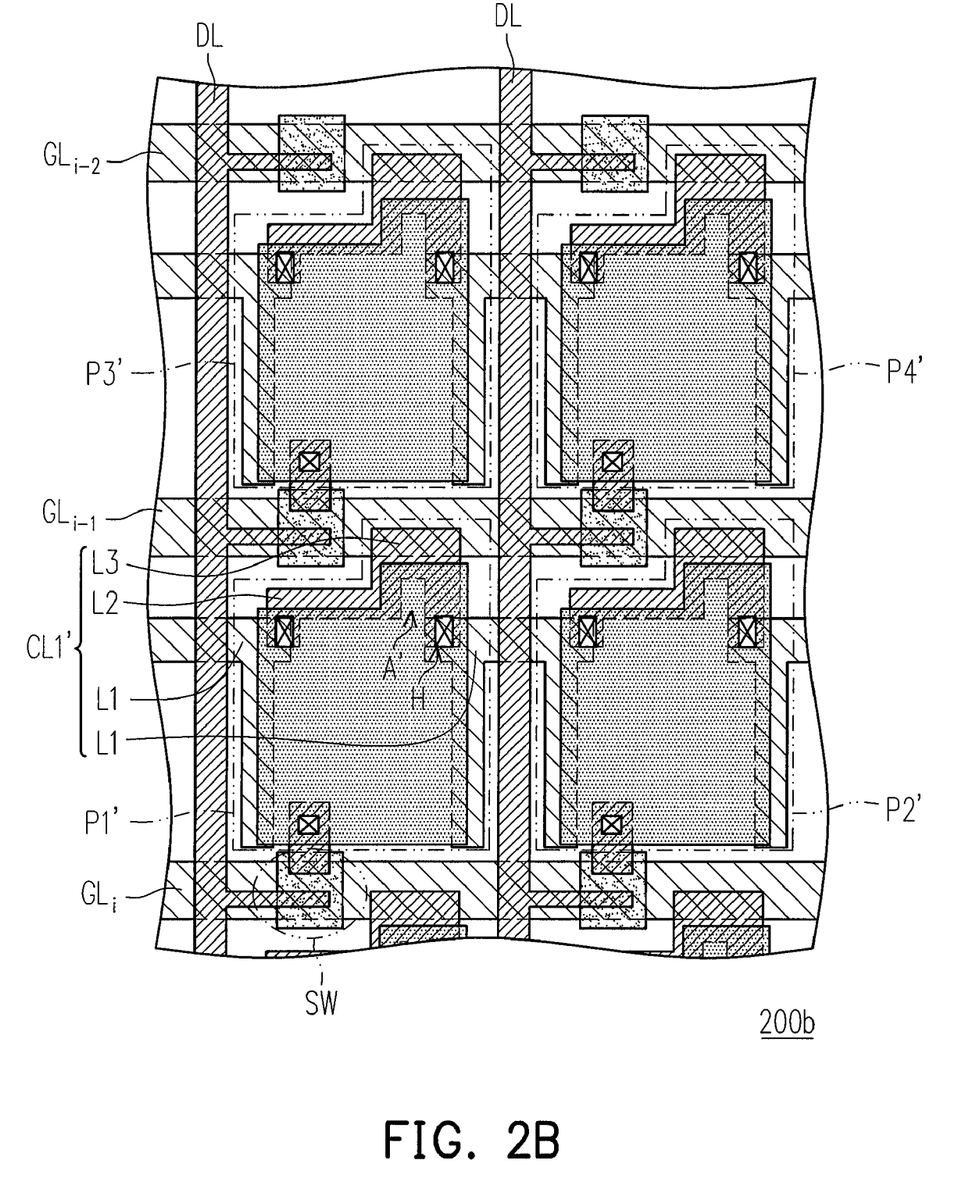

In light of the foregoing description, a layout design can take the form of a pixel array 200b depicted in FIG. 2B. In particular, at least a third line segment L3 can be further disposed in each common electrode line CL1'. The third line segment L3 and the second line segment L2 are coupled to each other and formed on the same film. In other words, the second and third line segments L2 and L3 are formed by the second conductive layer, for example. Moreover, the second and third line segments L2 and L3 and the scan lines GLi-2, GLi-1, GLi . . . are formed on different films. As clearly shown in FIG. 2B, this layout design frees a location A' from being occupied by the common electrode line CL1', thereby further enhancing the aperture ratio of the pixel units P1', P2', P3', P4' . . . . It should be mentioned that, since an insulating layer is disposed between the first and second conductive layers, the electrical interference of the stacking areas of the third line segment and the scan lines GLi-2, GLi-1, GLi . . . can be ignored.

That is, assuming in the pixel array 200b the scan lines GLi-2, GLi-1, GLi . . . and the first line segment L1 are formed by the first conductive layer, and assuming the data lines DL, the second line segment L2 and the third line segment L3 are formed by the second conductive layer disposed above the first conductive layer, then the common electrode line CL1' and the scan lines GLi-2, GLi-1, GLi . . . are disposed according to a layout design that has the third line segment L3 overlapping the scan lines GLi-2, GLi-1, GLi . . . .

However, in other embodiments, if the data lines DL, the second line segment L2 and the third line segment L3 are formed by the first conductive layer, whereas the scan lines GLi-2, GLi-1, GLi . . . and the first line segment L1 are formed by the second conductive layer disposed above the first conductive layer, then the common electrode line CL1' and the scan lines GLi-2, GLi-1, GLi . . . are disposed according to a layout design that has the scan lines GLi-2, GLi-1, GLi . . . overlapping the third line segment L3.

Second Embodiment

The spirit of the present embodiment is similar to the first embodiment. A major difference between the present embodiment and the first embodiment is that the first signal lines and the second signal lines are the data lines and the scan lines, respectively. Moreover, the data lines are arranged substantially parallel to the common electrode lines, whereas the scan lines intersect the common electrode lines. However, reference numbers in the present embodiment which are the same as or similar to those in the previous embodiment represent the same or similar elements. Accordingly, no further description thereof is provided hereinafter.

Figure 3A:
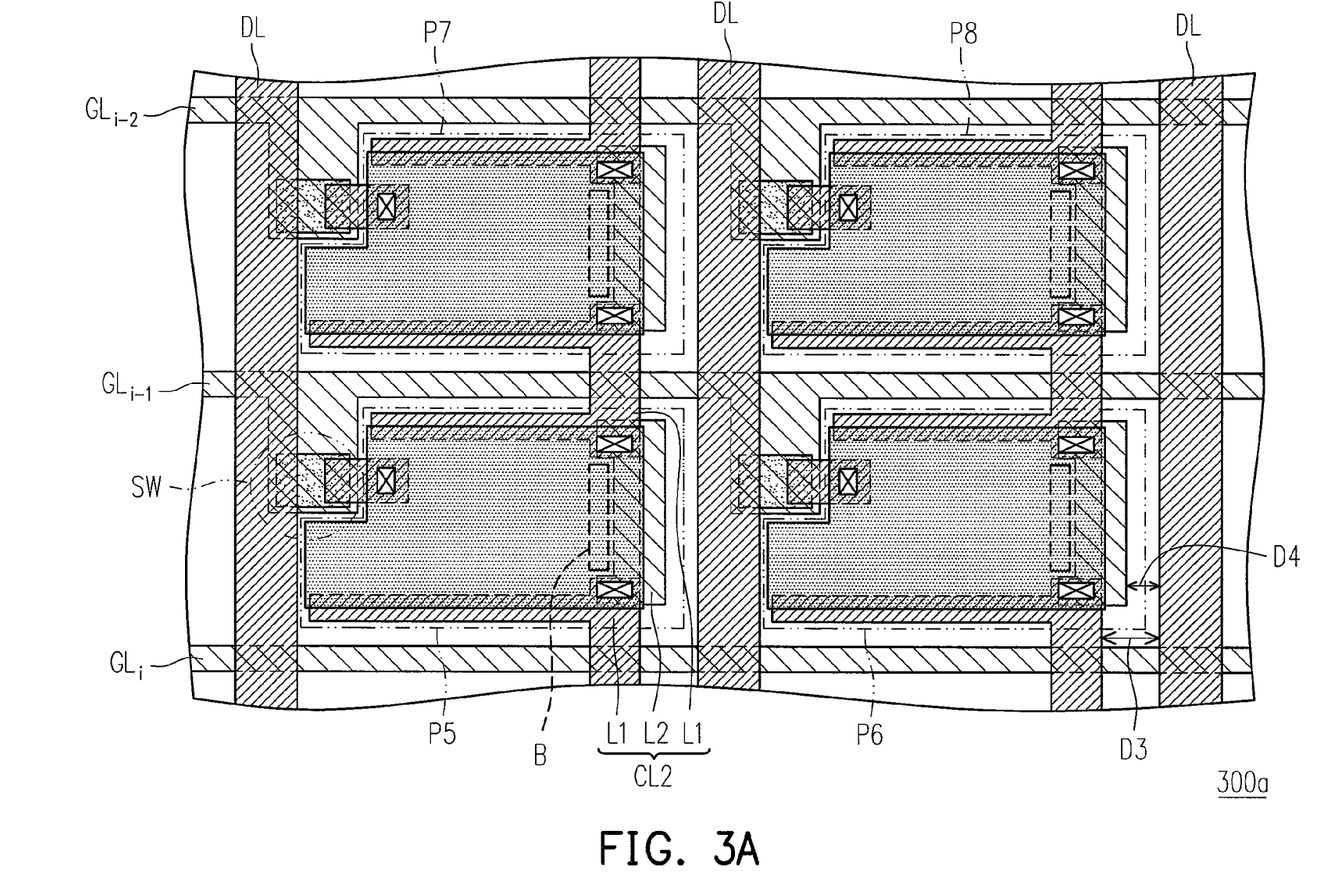
FIG. 3A and FIG. 3B are schematic top views illustrating two pixel arrays in accordance with a second embodiment of the invention.

FIG. 3A is a schematic top view illustrating a pixel array in accordance with a second embodiment of the invention. Referring to FIG. 3A, a pixel array 300a includes a plurality of scan lines GLi-2, GLi-1, GLi . . . , a plurality of data lines DL, a plurality of switch devices SW, and a plurality of pixel units P5, P6, P7, P8 . . . . The switch devices SW are TFTs, for example, and the pixel units P5, P6, P7, P8 . . . can be coupled to the scan lines GLi-2, GLi-1 . . . and the data lines DL through the switch devices SW.

In the present embodiment, the scan lines GLi-2, GLi-1, GLi . . . are formed by a first conductive layer (not drawn), for example, and the data lines are formed by a second conductive layer (not drawn), for instance. Since an insulating layer (not drawn) is disposed between the first conductive layer and the second conductive layer, the scan lines GLi-2, GLi-1, GLi . . . and the data lines DL are respectively formed on different films. Of course, since the actual layout of the films is performed according to product needs, the invention is not limited by the aforementioned layout scheme.

In the present embodiment, the pixel units P5, P6, P7, P8 . . . respectively include a common electrode line CL2. The common electrode CL2 is arranged substantially parallel to the data lines DL and intersecting the scan lines GLi-2, GLi-1, GLi . . . . Moreover, each common electrode line CL2 has at least a first line segment L1 and at least a second line segment L2 coupled to each other. As shown in FIG. 3A, the first line segment L1 is arranged substantially parallel to the data lines DL and intersecting the scan lines GLi-2, GLi-1, GLi.

In the present embodiment, since the first line segment L1 is formed by the second conductive layer, for example, and the second line segment L2 is formed by the first conductive layer, for instance, the first line segment L1 and the second line segment L2 are formed on different films. In practice, the first line segment L1 and the second line segment L2 can be electrically coupled through at least a contact window H.

In the present embodiment, although the first line segment L1 and the data lines DL are formed on the same film, the second line segment L2 and the data lines DL are respectively formed on different films, therefore a distance D4 between the second line segment L2 and the data lines DL can be less than a distance D3 between the first line segment L1 and the data lines DL. As shown in FIG. 3A, since the common electrode line CL2 is not disposed in a location B, the aperture ratio of the pixel units P5, P6, P7, P8 . . . is enhanced accordingly.

Figure 3B:
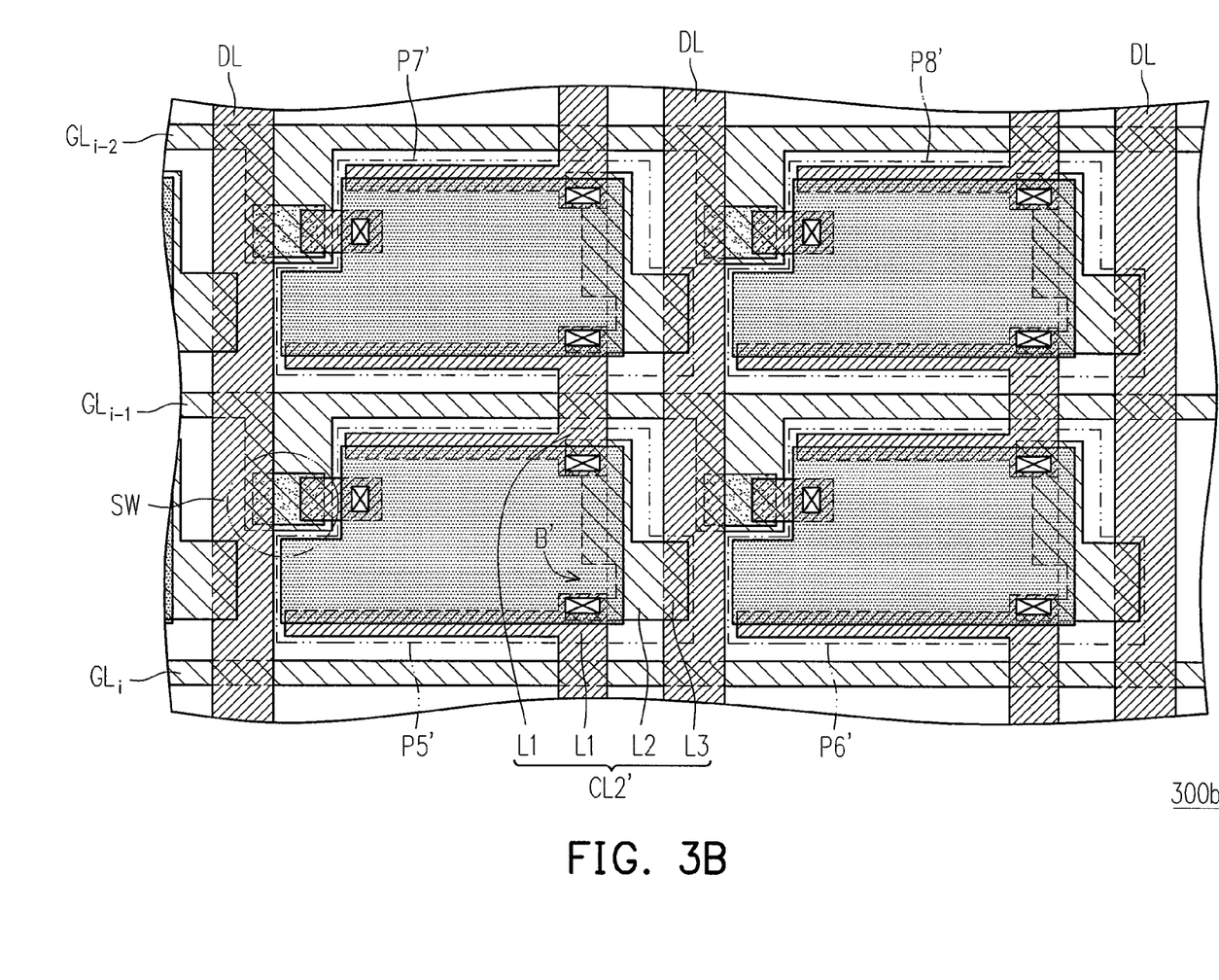

In light of the foregoing description, a layout design can take the form of a pixel array 300b depicted in FIG. 3B. In particular, at least a third line segment L3 can be further disposed in each common electrode line CL2'. The third line segment L3 and the second line segment L2 are coupled to each other and formed on the same film. In other words, the second and third line segments L2 and L3 are formed by the first conductive layer. Moreover, the second and third line segments L2 and L3 and the data lines DL are formed on different films. As clearly shown in FIG. 3B, this layout design frees a location B' from being occupied by the common electrode line CL2', thereby further enhancing the aperture ratio of the pixel units P5', P6', P7', P8' . . . . It should be mentioned that, since an insulating layer (not drawn) is disposed between the first and second conductive layers, the electrical interference of the stacking areas of the third line segment L3 and the data lines DL can be ignored.

Lastly, since the above-described embodiment assumes the scan lines GLi-2, GLi-1, GLi . . . and the second and third line segments L2 and L3 are formed by the first conductive layer, and assumes the data lines DL and the first line segment L1 are formed by the second conductive layer disposed above the first conductive layer, the common electrode line CL2' and the data lines DL are disposed, for example, according to a layout design that has the data lines DL overlapping the third line segment L3.

In other embodiments, an alternate layout scheme can be forming the data lines DL and the first line segment L1 by the first conductive layer, and forming the scan lines GLi-2, GLi-1, GLi . . . and the second and third line segments L2 and L3 by the second conductive layer disposed above the first conductive layer. Accordingly, the layout design of the common electrode line CL2' and the data lines DL has the third line segment L3 overlapping the data lines DL.

In light of the foregoing, according to the invention, since the common electrode lines of the pixel electrodes are not formed by just a single film, either the scan lines or the data lines can be disposed closer to the common electrode lines, whereby a high aperture ratio can be obtained for the pixel arrays embodied herein. By applying the pixel arrays embodied herein in a display apparatus, the brightness and contrast of the displayed images can be enhanced, thereby improving display quality.

Although the invention has been described with reference to the above embodiments, it will be apparent to one of ordinary skill in the art that modifications to the described embodiment may be made without departing from the spirit of the invention. Accordingly, the scope of the invention will be defined by the attached claims not by the above detailed descriptions.

What is claimed is:

1. A pixel array, comprising a plurality of first signal lines, a plurality of second signal lines, a plurality of switch devices, and a plurality of pixel units, the first signal lines and the second signal lines formed on different films, and the pixel units are coupled to the first signal lines and the second signal lines through the switch devices, wherein each of the pixel units of an $i^{th}$ row comprises:

a common electrode line, comprising at least a first line segment and at least a second line segment coupled to the first line segment, wherein the first line segment and the second line segment are formed different films, and a shortest distance between an $(i-1)^{th}$ first signal line and the first line segment is not equal to a shortest distance between the $(i-1)^{th}$ first signal line and the second line segment, wherein, the first signal lines are either a plurality of scan lines or a plurality of data lines of the pixel array, and the second signal lines are the other kind.

2. The pixel array as claimed in claim 1, wherein when the first signal lines are the scan lines and the second signal lines are the data lines, in each of the pixel units of the $i^{th}$ row, a distance between an $(i-1)^{th}$ scan line and the second line segment is smaller than a distance between the $(i-1)^{th}$ scan line and the first line segment.

3. The pixel array as claimed in claim 2, wherein each of the scan lines and a neighboring second line segment are formed on different films.

4. The pixel array as claimed in claim 2, wherein each of the scan lines and a neighboring first line segment are formed on a same film.

5. The pixel array as claimed in claim 2, wherein the scan lines are arranged substantially parallel to the common electrode lines.

6. The pixel array as claimed in claim 2, wherein the data lines intersect the common electrode lines.

7. The pixel array as claimed in claim 2, wherein each of the common electrode lines further comprises at least a third line segment coupled to the second line segment.

8. The pixel array as claimed in claim 7, wherein in each of the pixel units of the $i^{th}$ row, the third line segment overlaps the $(i-1)^{th}$ scan line.

9. The pixel array as claimed in claim 7, wherein in each of the pixel units of the $i^{th}$ row, the $(i-1)^{th}$ scan line overlaps the third line segment.

10. The pixel array as claimed in claim 7, wherein the third line segment and second line segment are formed on the same film, and each of the scan lines and a neighboring third line segment are formed on different films.

11. The pixel array as claimed in claim 1, wherein when the first signal lines are the data lines and the second signal lines are the scan lines, in each of the pixel units of the row, a distance between an $(i-1)^{th}$ data line and the second line segment is smaller than a distance between the $(i-1)^{th}$ data line and the first line segment.

12. The pixel array as claimed in claim 11, wherein each of the data lines and a neighboring second line segment are formed on different films.

13. The pixel array as claimed in claim 11, wherein each of the data lines and a neighboring first line segment are formed on the same film.

14. The pixel array as claimed in claim 11, wherein the data lines are arranged substantially parallel to the common electrode lines.

15. The pixel array as claimed in claim 11, wherein the scan lines intersect the common electrode lines.

16. The pixel array as claimed in claim 11, wherein each of the common electrode lines further comprises at least a third line segment coupled to the second line segment.

17. The pixel array as claimed in claim 16, wherein in each of the pixel units of the $i^{th}$ row, the third line segment overlaps the $(i-1)^{th}$ data line.

18. The pixel array as claimed in claim 16, wherein in each of the pixel units of the $i^{th}$ row, the $(i-1)^{th}$ data line overlaps the third line segment.

19. The pixel array as claimed in claim 16, wherein the third line segment and second line segment are formed on the same film, and each of the data lines and a neighboring third line segment are formed on different films.

20. The pixel array as claimed in claim 1, wherein an extending direction of the first line segment of the common electrode line is parallel to an extending direction of the first signal lines, and an extending direction of the second line segment of the common electrode line is parallel to the extending direction of the first signal lines.

21. The pixel array as claimed in claim 1, wherein the first line segment and the second line segment are electrically connected to each other through at least one contact window.

* * * * *